(12) United States Patent
Doan et al.

(10) Patent No.: US 9,231,152 B2
(45) Date of Patent: Jan. 5, 2016

(54) LIGHT EMITTING DIODE

(71) Applicant: SemiLEDS Optoelectronics Co., Ltd., Miao-Li County (TW)

(72) Inventors: Trung-Tri Doan, Hsinchu County (TW); Chao-Chen Cheng, Miao-Li County (TW); Yi-Feng Shih, Miaoli County (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 185 days.

(21) Appl. No.: 13/845,511

(22) Filed: Mar. 18, 2013

(65) Prior Publication Data

US 2014/0070164 A1   Mar. 13, 2014

(30) Foreign Application Priority Data

Sep. 11, 2012  (CN) .......................... 2012 1 0335502

(51) Int. Cl.
  *H01L 33/04*   (2010.01)
  *H01L 25/075*  (2006.01)
  *H01L 33/62*   (2010.01)

(52) U.S. Cl.
  CPC ............ *H01L 33/04* (2013.01); *H01L 25/0753* (2013.01); *H01L 33/62* (2013.01); *H01L 2924/0002* (2013.01)

(58) Field of Classification Search
  CPC ........................... H01L 25/0753; H01L 33/04
  See application file for complete search history.

(56) References Cited

U.S. PATENT DOCUMENTS

| | | | | |
|---|---|---|---|---|
| 7,846,755 | B2 * | 12/2010 | Kal et al. | 438/34 |
| 2010/0320483 | A1 * | 12/2010 | Kadotani et al. | 257/88 |

* cited by examiner

*Primary Examiner* — Amar Movva
(74) *Attorney, Agent, or Firm* — Stephen A. Gratton

(57) ABSTRACT

The present invention provides a light emitting diode, which comprises a first LED die, a second LED die, and a dummy LED die, wherein the second LED die is disposed between the first LED die and the dummy LED die, and each die comprises a first semi-conductive layer, a second semi-conductive layer, and a multiple quantum well layer disposed between the first and the second semi-conductive layers. The first semi-conductive layer of the first LED die is coupled to the second semi-conductive layer of the second LED die, and the first semi-conductive layer of the second LED die is coupled to the first and second semi-conductive layers of the dummy LED die.

5 Claims, 3 Drawing Sheets

LIGHT EMITTING DIODE

FIELD OF THE INVENTION

The present invention relates to a light emitting diode, and more particularly, to a light emitting diode with serially connected structure.

BACKGROUND OF THE INVENTION

With rapid technical progress in light emitting diode (LED) technology, LEDs nowadays present many advantages over incandescent light sources including lower energy consumption, longer lifetime, smaller size, and lighter in weight. Recently, light emitting diodes are available in a wide range of colors with the most common being RED, BLUE and GREEN and are thus widely used in the backlight modules for displaying devices, such as cellular phones and LCDs. Nevertheless, heat dissipation is always the main issue restricting the improvement in LED luminous efficiency. Thus, with rising power output, it has grown increasingly necessary to shed excess heat with efficient heat transfer to maintain reliability for all LED manufacturers.

When a conventional LED is excited by the flow of current, generally the temperatures of components in the LED can be raised to above normal due to leakage current effect inside the semiconductor die of the LED and also inefficient heat transfer from the semiconductor die to the surrounding environment. Such above-normal temperature not only will cause damage to the components and speed the aging of the same as well, but also the optical properties of the LED are going to change with the temperature variation. For instance, the power output of an LED may reduce with the increasing of its temperature. In addition, as the color of light emitted from an LED, and thus its wavelength is determined by the energy gap of it semiconductor die, and since the energy gap is varying with the temperature variation of the semiconductor die, the wavelength of light emitted from the LED will change with the temperature variation.

In view of the heat dissipation problem that are common to the conventional LEDs, it is in need of an innovative LED that is able to reduce the leakage current and lower the in the LED economically and effectively.

Conventionally, as a voltage of 3V is usually the voltage required for exciting an LED, the drivers for LED excitation generally are configured with a voltage conversion circuit for dropping voltage to 3V from 110V. However, since the driver will have to be built large enough so as to accommodate the voltage conversion circuit, the application flexibility of LEDs is diminished.

SUMMARY OF THE INVENTION

The present invention provides a light emitting diode, which has a serially connected structure formed by coupling the semi-conductive layers of two LED dies that are arranged neighboring to each other inside the light emitting diode, whereby the consuming current and heat generation of the light emitting diode are lowered so that the size of heat dissipating device for the light emitting diode can be reduced and illumination of the light emitting diode can be enhanced.

The present invention provides a light emitting diode, which has a serially connected structure formed by coupling a p-type semi-conductive layer of one LED dies with an n-type semi-conductive layer of another LED dies while the two LED dies are arranged neighboring to each other inside the light emitting diode, whereby the consuming current and heat generation of the light emitting diode are lowered so that the size of heat dissipating device for the light emitting diode can be reduced and illumination of the light emitting diode can be enhanced.

The present invention provides a light emitting diode, in which owing to the coupling of the first semi-conductive layer of one LED die to the first and second semi-conductive layers of another neighboring LED die, the p-type junctions and the n-type junctions of the light emitting diode are located at the same side thereof. Consequently, the light emitting diode of the present invention can be mounted and packaged on a printed circuitboard directly by the use of a chip-on-board (COB) semiconductor assembly technique without the interconnections achieved by wire bonding, whereby, the defective rate resulting from poor wire bonding can be reduced and the reliability of the light emitting diode is enhanced. Moreover, the size of the light emitting diodes that are packaged using COB process can be reduced.

In an embodiment, the present invention provides a light emitting diode, which comprises a first LED die, a second LED die, and a dummy LED die, wherein the second LED die is disposed between the first LED die and the dummy LED die, and each die comprises a first semi-conductive layer, a second semi-conductive layer, and a multiple quantum well layer disposed between the first and the second semi-conductive layers. The first semi-conductive layer of the first LED die is coupled to the second semi-conductive layer of the second LED die, and the first semi-conductive layer of the second LED die is coupled to the first and second semi-conductive layers of the dummy LED die.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
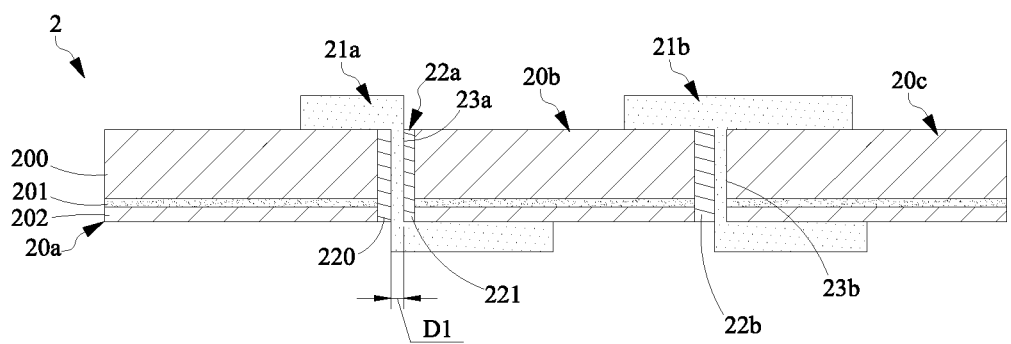
FIG. 1 is a schematic diagram showing a light emitting diode according to a first embodiment of the present invention.

Please refer to FIG. 1, which is a schematic diagram showing a light emitting diode according to a first embodiment of the present invention. As shown in FIG. 1, the light emitting diode 2 comprises: a first LED die 20a, a second LED die 20b, and a dummy LED die 20c, wherein the second LED die 20b is disposed between the first LED die 20a and the dummy LED die 20c, and each die comprises a first semi-conductive layer 200, a second semi-conductive layer 202, and a multiple quantum well (MQW) layer 201 that is disposed between the first and the second semi-conductive layers 200, 202 while engaging to the two layers 200, 202. In this embodiment, the first semi-conductive layer 200 is disposed engaging to the upper surface of the MQW layer 201 while allowing the second semi-conductive layer 202 to be disposed engaging to the bottom surface of the MQW layer 201.

It is noted that the first semi-conductive layer 200 can be a p-type semi-conductive layer or an n-type semi-conductive layer. In an embodiment when the first semi-conductive layer 200 is substantially a p-type semi-conductive layer, correspondingly the second semi-conductive layer 202 should be an n-type semi-conductive layer; and vice versa, when the first semi-conductive layer 200 is substantially an n-type semi-conductive layer, correspondingly the second semi-conductive layer 202 should be a p-type semi-conductive layer. Moreover, the p-type semi-conductive layer can be made of a p-type III-nitride material, such as p-GaN, p-AlGaN, p-AlGaInN, p-InGaN, p-AlN, and the like, but is not limited thereby. In this embodiment, p-GaN is selected to be used as the material for making the p-type semi-conductive layer in the present invention. Similarly, the n-type semi-conductive layer can be made of a n-type III-nitride material, such as n-GaN, n-InGaN, n-AlGaInN, n-AlInGaN, and the like, but is not limited thereby. In this embodiment, n-GaN is selected to be used as the material for making the n-type semi-conductive layer in the present invention. As for the MQW layer 201, it can be made of a semiconductor material, such as GaAs and AlGaAs. In addition, the three-layer structure of the aforesaid first semi-conductive layer 200, second semi-conductive layer 202 and MQW layer 201 can be formed and achieved using a method selected from the group consisting of: a method of metal-organic chemical vapor deposition (MOCVD), a method of molecular beam epitaxy (MBE), a method of vapor phase epitaxy (VPE) and the like. Thereafter, the three-layer structure is further being processed by a method selected from the group consisting of: a method of dry etching, a method of wet etching, a method of reactive ion etching (RIE) or a method of laser etching, so as to be formed into the corresponding LED die.

As shown in FIG. 1, the first semi-conductive layer 200 of the first LED die 20a is coupled to the second semi-conductive layer 202 of the second LED die 20b; and the first semi-conductive layer 200 of the second LED die 20b is coupled to the dummy LED die 20c. In the embodiment, the first semi-conductive layer 200 of the second LED die 20b is coupled to the first and second semi-conductive layers 200, 202 of the dummy LED die 20c as well as the MQW layer 201 thereof. In addition, there is further a first insulation component 22a formed at a position between the first LED die 20a and the second LED die 20b, whereas there is also another first insulation component 22b formed at a position between the second LED die 20b and the dummy LED die 20c. It is noted that the first insulation component 22a is formed with a via hole 23a, while the first insulation component 22b is formed with another via hole 23b, whereas the insulation component 22a is being divided by the via hole 23a into a first insulation element 220 and a second insulation element 221. Moreover, any of the two first insulation components 22a and 22b can be made of a material selected from the group consisting of: SiO$_2$, Si$_3$N$_4$, TiO$_2$, Al$_2$O$_3$, HfO$_2$, Ta$_2$O$_5$, a photo resistance (PR) material, and an epoxy, and the like. In addition, the first insulation components 22a and 22b can be formed in the light emitting diode 2 using a deposition method, such as chemical vapor deposition (CVD), plasma enhanced CVD (PECVD), atomic layer deposition (ALD), printing or coating. Thereafter, a yellow light chemical etching process can be used for defining patterns on the resulting insulation component. Moreover, the via holes can be formed using an etching process, such as a dry etching process, a wet etching process, a RIE process or a laser etching process. Meanwhile, in this embodiment, the two first insulation components 22a and 22b are made of the same material, whereas the first insulation element 220 and the second insulation element 221 are made of the same material. Moreover, the via hole 23a is formed with a diameter D that is smaller than 1000 μm, which is also true for the via hole 23b. In another embodiment of the invention, the diameter D of the via hole 23a as well as that of the via hole 23b are smaller than 200 μm, while in further another embodiment, the diameter D of the via hole 23a or via hole 23b can be smaller than 100 μm. It is noted that although in the embodiment shown in FIG. 1, the first insulation component 22a and the second insulation component 22b are made of the same insulation material, but in another embodiment, the first insulation component 22a and the second insulation component 22b can be made of different insulation materials.

In this embodiment, the coupling of the first semi-conductive layer 200 of the first LED die 20a to the second semi-conductive layer 202 of the second LED die 20b is achieved using a first electrode assembly 21a by way of the via hole 23a. As shown in FIG. 1, the first LED die 20a is insulated from the first electrode assembly 21a by the first insulation element 220 of the first insulation component 22a; while the second LED die 20b is insulated from the first electrode assembly 21a by the second insulation element 221 of the first insulation component 22a; and simultaneously the second LED die 20b is insulated from the second electrode assembly 21b by another first insulation component 22b. In an embodiment, the first electrode assembly 21a is coupled and engaged to a portion of the first semi-conductive layer 200 of the first LED die 20a, and is also simultaneously coupled and engaged to a portion of the second semi-conductive layer 202 of the second LED die 20b.

Similarly, the coupling of the first semi-conductive layer 200 of the second LED die 20b to the second semi-conductive layer 202 of the dummy LED die 20c is achieved using a second electrode assembly 21b by way of the via hole 23b. As shown in FIG. 1, the second electrode assembly 21b is coupled and engaged to a portion of the first semi-conductive layer 200 of the second LED die 20b, and is also simultaneously coupled and engaged to a portion of the first semi-conductive layer 200 as well as a portion of the second semi-conductive layer 202 of the dummy LED die 20c. It is noted that each of the first and the second the electrode assemblies 20a and 20b is made of a conductive metal in a form of a single metal layer, or a multiple metal layers. It is noted that any one layer in either the single metal layer or the multiple metal layers can be made of a conductive material, so as to achieve a formation, such as Cr/Au, Cr/Al, Cr/Pt/Au, Cr/Ni/Au, Cr/Al/Pt/Au, Cr/Al/Ni/Au, Ti/Al, Ti/Au, Ti/TiW/Au. Ti/Al/Pt/Au, TiW/Au, Ti/Al/Ni/Au, NiV/Au, Al, Al/Pt/Au, Al/Pt/Al, Al/Ni/Au, Al/Ni/Al, Al/W/Al, Al/W/Au, Al/TaN/Al, Al/TaN/Au, Al/Mo/Au, or Ti/NiV/Au, whereas any Au used in the foregoing structure can be replaced by Cu.

Figure 2:
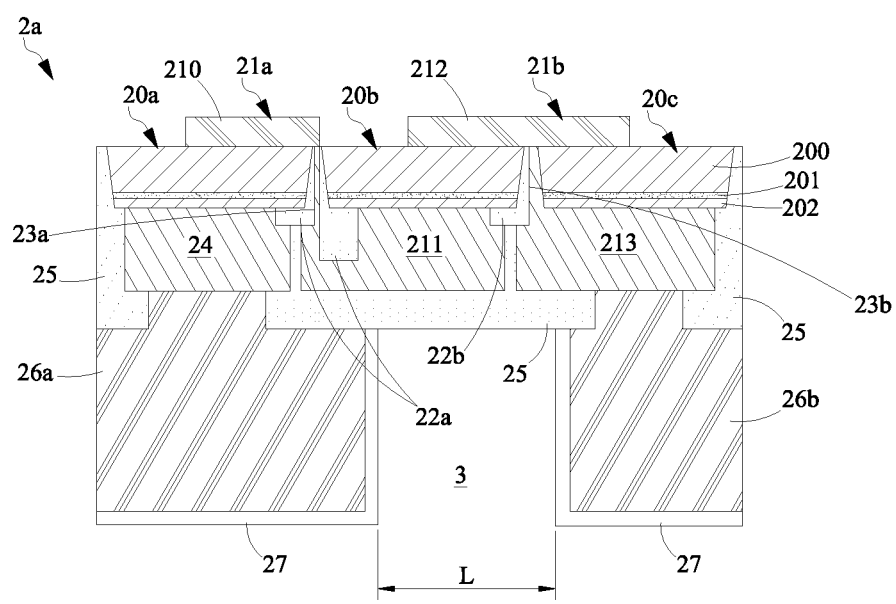
FIG. 2 is a schematic diagram showing a light emitting diode according to a second embodiment of the present invention.

Please refer to FIG. 2, which is a schematic diagram showing a light emitting diode according to a second embodiment of the present invention. In the embodiment shown in FIG. 2, the light emitting diode 2a comprises: a first LED die 20a, a second LED die 20b, and a dummy LED die 20c, in which the first LED die 20a, the second LED die 20b and the dummy LED die 20c are structured and arranged the same as those described in the embodiment shown in FIG. 1, and thus will not be described further herein. In the embodiment of FIG. 2, the first semi-conductive layer 200 is an n-type semi-conductive layer, while the second semi-conductive layer 202 is a p-type semi-conductive layer. Similarly, there is a first insulation component 22a formed at a position between the first LED die 20a and the second LED die 20b, and also another first insulation component 22b formed at a position between the second LED die 20b and the dummy LED die 20c. In addition, the first insulation components 22a is formed with a via hole 23a, while the other first insulation components 22b is formed with a via hole 23b. As the two first insulation components 22a, 22b are made of a material the same as the two described in the first embodiment shown in FIG. 1, it is not described further herein.

In the embodiment shown in FIG. 2, the first electrode assembly 21a is similarly disposed for allowing the same to connect to the first semi-conductive layer 200 of the first LED die 20a and the second semi-conductive layer 202 of the second LED die 20b by way of the via hole 23a. In addition, in this embodiment, the first electrode assembly 21a also includes a first electrode 210 and a second electrode 211, whereby the first electrode 210 is formed on the first semi-conductive layer 200 of the first LED die 20a, and the second electrode 211 is formed on the second semi-conductive layer 202 of the second LED die 20b while allowing the same to electrically connect to the first electrode by an extension of the second electrode 211 that is disposed extending through the via hole 23a. In addition, the second electrode assembly 21b is disposed for allowing the same to connect to the first semi-conductive layer 200 of the second LED die 20b and the first and second semi-conductive layers 200, 202 as well as the MQW layer 201 of the dummy LED die 20c by way of the via hole 23b. Moreover, in this embodiment, the second electrode assembly 21b also includes a third electrode 212 and a fourth electrode 213, whereby the third electrode 212 is formed on the first semi-conductive layer 200 of the second LED die 20b, and the fourth electrode 213 is formed on the second semi-conductive layer 202 of the dummy LED die 20c while allowing the same to electrically connect to the third electrode 212, and the first and second semi-conductive layers 200, 202 as well as the MQW layer 201 of the dummy LED die 20c by an extension of the fourth electrode 213 that is disposed extending through the via hole 23b.

Moreover, there is further a fifth electrode 24 disposed attaching to the bottom of the second semi-conductive layer 202 of the first LED die 20a, whereas the fifth electrode 24 is insulated from the second electrode 211 and the fourth electrode 213 by the use of a second insulation component 25. Similarly, the first insulation component 22a, 22b and the second insulation component 25 can respectively be made of a material selected from the group consisting of: $SiO_2$, $Si_3N_4$, $TiO_2$, $Al_2O_3$, $HfO_2$, $Ta_2O_5$, a photo resistance (PR) material, and an epoxy, and the like. In addition, each of the first and the second insulation component 22a, 22b, 25 is formed in the light emitting diode 2 using a deposition method, such as chemical vapor deposition (CVD), plasma enhanced CVD (PECVD), atomic layer deposition (ALD), printing or coating. Thereafter, a yellow light chemical etching process can be used for defining patterns on the resulting insulation component. It is noted that the first insulation component 22a, 22b and the second insulation component 25 can be made of the same material or different materials according to actual requirement. Moreover, the third electrode 212, the fourth electrode 213 and the fifth electrode 24 can be made of a material that can be selected from the same group for the first electrode assembly 21a and second electrode assembly 21b as described in the embodiment shown in FIG. 1, and thus will not described further herein. It is noted that if the second semi-conductive layer 202 is selected to be a p-type semi-conductive layer, the fifth electrode 24 should be a p-type electrode; and vice versa, if the second semi-conductive layer 202 is selected to be an n-type semi-conductive layer, the fifth electrode 24 should be an n-type electrode. In addition, the fifth electrode 24 is further connected to a first metallic alloy component 26a that is engaged to the bottom of the fifth electrode 24, and similarly, the fourth electrode 213 is also connected to a second metallic alloy component 26b that is engaged to the bottom of the fourth electrode 213, whereas the first and the second metallic alloy components 26a and 26b are insulated from each other by the use of a first groove 3 while being arranged at a distance L away from each other. In this embodiment, the distance L is smaller than 1000 μm.

In addition, each of the first and the second metallic alloy component 26a, 26b is made of an ally composed of at least two metals selected from the group consisting of: Cu, Ni, Ag, Co, Al, Sn, W, Mo, Pd, Pt, Rh. The method of achieving and forming such metallic alloy components 26a and 26b in the light emitting diode 2 of the present invention can be a means selected from the group consisting of: sputtering, PVD, electroplating, electroless plating, printing and the like. Moreover, there is a protective layer 27 formed on the surfaces of the first and the second metallic alloy component 26a, 26b, that can be mad of Ni or Au, and is achieved by an electroplating means, or an electroless plating means.

Figure 3:
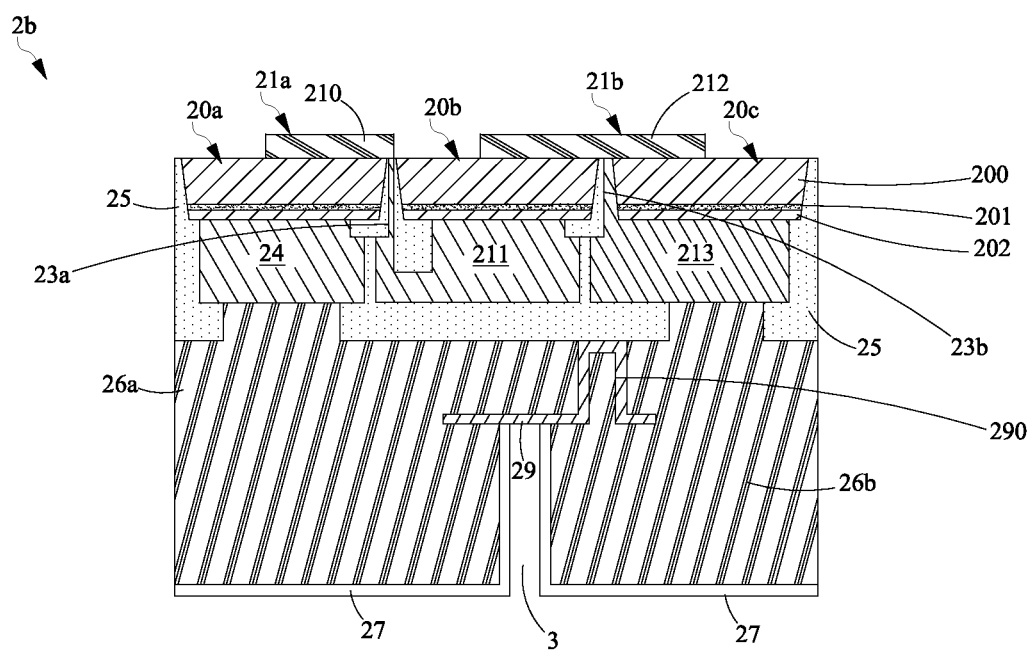
FIG. 3 is a schematic diagram showing a light emitting diode according to a third embodiment of the present invention.

Please refer to FIG. 3, which is a schematic diagram showing a light emitting diode according to a third embodiment of the present invention. In the embodiment shown in FIG. 3, the light emitting diode 2b is structured about the same as the one described in the second embodiment shown in FIG. 2, but is different in that: there is a third insulation component 29 formed between the first metallic alloy component 26a and the second metallic alloy component 26b that is to be used for insulating the first and the second metallic alloy components 26a and 26b from each other. Moreover, there is further a second groove 290 formed on the third insulation component 29, while there is similarly a first groove 3 being arranged between the first metallic alloy component 26a and the second metallic alloy component 26b, but at a position not aligning with the second groove 290. In this embodiment, the second metallic alloy component 26b is disposed filling the second groove 290. By the structure of the third insulation component, the structural integrity of the light emitting diode 2B can be enhanced. Moreover, although the serially connected structures in the embodiments of the present invention are illustrated using only three LED dies, but it is not limit thereby in actual application, i.e. there can be one, two or more than three LED dies forming the serially connected structures that is described in the present invention. That is, there can be $N_m$ LED dies in a light emitting diode of the present invention, whereas m=1~n; and n>3, and the connection between the $N_1$~$N_{n-1}$ LED dies can be achieved in a way the same as the connection between the first LED die 20a and the second LED die 20b shown in the first embodiment, while the connection between the $N_{n-1}$~$N_n$ LED dies can be achieved in a way the same the connection between the second LED die 20b and the dummy LED die 20c shown in the second and third embodiments.

When any of the aforesaid light emitting diodes 2, 2a, and 2b is being excited by a flow of current, there is almost no leakage current inside the light emitting diode of the invention. Moreover, by the serially connected structure achieved by the coupling of the first semi-conductive layer 200 of the first LED die 20a to the second semi-conductive layer 202 of the second LED die 20b, the consuming current and heat generation of the light emitting diode 2, 2a or 2b are lowered so that the size of heat dissipating device for the light emitting diode can be reduced and illumination of the light emitting diode can be enhanced. In addition, since a simple bridge rectifier circuit is sufficient for high-voltage LED, the size of the LED package can further be reduced with lower cost. Consequently, not only the overall performance of the light emitting diode is enhanced directly or indirectly, but also the application diversity and applicability of the light emitting diode are enhanced simultaneously.

In the light emitting diode 2, 2a, or 2b of the present invention, owing to the coupling of the first semi-conductive layer 200 of the second LED die 20b to the first and second semi-conductive layers 200, 202 of the dummy LED die 20c, the p-type junctions and the n-type junctions of the light emitting diode are located at the same side thereof. Consequently, the light emitting diode of the present invention can be mounted and packaged on a printed circuitboard directly by the use of a chip-on-board (COB) semiconductor assembly technique without the interconnections achieved by wire bonding, whereby, the defective rate resulting from poor wire bonding can be reduced and the reliability of the light emitting diode is enhanced. Moreover, the size of the light emitting diodes that are packaged using COB process can be reduced.

In addition, the light emitting diode of the present invention is designed to be excited by a voltage of 12V. Consequently, a lamination device that is composed of two light emitting diodes of the present invention will require a 24V driving circuit, a lamination device that is composed of three light emitting diodes of the present invention will require a 36V driving circuit, and so forth. Thus, the size of the drivers for exciting the LED can be reduced since the corresponding voltage conversion circuit required in the driving circuit of the present invention is smaller than that of a conventional LED. Since the size of heat dissipating device and also that of the driver for the light emitting diode of the present invention are reduced, the usage flexibility of the light emitting diode of the present invention is enhance and thus the field of application of the light emitting diode is widened.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting diode comprising:
   a first LED die, a second LED die, and a dummy LED die, each die comprising: a first semi-conductive layer, a second semi-conductive layer, and a multiple quantum well layer between the first semi-conductive layer and the second semi-conductive layer, the dummy LED die configured to electrically couple the first semi-conductive layer of the first LED die to the first semi-conductive layer and to the second semi-conductive layer of the second LED die;
   a first via hole between the first LED die and the second LED die electrically connecting the first semi-conductive layer of the first LED die to the second semi-conductive layer of the second LED die;
   a first electrode assembly electrically connected to the first semi-conductive layer of the first LED die and electrically connected to the first via hole;
   a second via hole between the second LED die and the dummy LED die electrically connecting the first semi-conductive layer of the second LED die to the first semi-conductive layer and to the second semi-conductive layer of the dummy LED die; and
   a second electrode assembly electrically connected to the first semi-conductive layer of the second LED die, electrically connected to the first semi-conductive layer of the dummy LED die, and electrically connected to the second via hole;
   the first electrode assembly and the second electrode assembly located on a same side of the light emitting diode.

2. The light emitting diode of claim 1 wherein the first via hole comprises a first insulation component and the second via hole comprises a second insulation component.

3. The light emitting diode of claim 1 wherein the first electrode assembly and the second electrode assembly are configured for chip-on-board assembly.

4. The light emitting diode of claim 1 wherein the first semi-conductive layer comprises an n-type semiconductor and the first electrode and the second electrode engage the first semi-conductive layer.

5. A light emitting diode comprising:
   a first LED die, a second LED die, and a dummy LED die, each die comprising: a first semi-conductive layer comprising an n-type semiconductor, a second semi-conductive layer comprising a p-type semiconductor, and a multiple quantum well layer between the first semi-conductive layer and the second semi-conductive layer, the dummy LED die configured to electrically couple the first semi-conductive layer of the first LED die to the first semi-conductive layer and to the second semi-conductive layer of the second LED die;
   the first LED die and the second LED separated and electrically connected by an electrically insulated first via hole electrically connecting the first semi-conductive layer of the first LED die to the second semi-conductive layer of the second LED die;
   a first electrode assembly electrically connected to and engaging the first semi-conductive layer of the first LED die and electrically connected to the first via hole;
   the second LED die and the dummy LED die separated and electrically connected by an electrically insulated second via hole electrically connecting the first semi-conductive layer of the second LED die to the first semi-conductive layer and to the second semi-conductive layer of the dummy LED die; and
   a second electrode assembly electrically connected to and engaging the first semi-conductive layer of the second LED die, electrically connected to and engaging the first semi-conductive layer of the dummy LED die, and electrically connected to the second via hole;
   the first electrode assembly and the second electrode assembly located on a same side of the light emitting diode permitting a chip-on-board assembly.

* * * * *